United States Patent [19]

Nishitani et al.

[11] Patent Number: 4,830,891
[45] Date of Patent: May 16, 1989

[54] METHOD FOR SELECTIVE DEPOSITION OF METAL THIN FILM

[75] Inventors: Eisuke Nishitani, Yokohama; Susumu Tsuzuku, Tokyo; Mitsuo Nakatani, Yokohama; Masaaki Maehara, Tokyo; Mitsuaki Horiuchi, Hachioji; Koichiro Mizukami, Akishima, all of Japan

[73] Assignee: Hitachi, Ltd., Tokyo, Japan

[21] Appl. No.: 126,430

[22] Filed: Nov. 30, 1987

[30] Foreign Application Priority Data

Dec. 1, 1986 [JP] Japan .................. 61-284302

[51] Int. Cl.$^4$ .............................................. C23C 16/08
[52] U.S. Cl. .................... 427/253; 427/255; 427/255.1
[58] Field of Search ............. 427/253, 255, 255.1, 427/264, 271, 258

[56] References Cited

U.S. PATENT DOCUMENTS

| | | | |
|---|---|---|---|
| 3,697,342 | 10/1972 | Cuomo | 427/253 |
| 3,697,343 | 10/1972 | Cuomo et al. | 427/253 |
| 4,181,758 | 1/1980 | Elam | 427/253 |
| 4,321,073 | 3/1982 | Blair | 427/253 |
| 4,496,609 | 1/1985 | McNeilly et al. | 427/253 |
| 4,540,607 | 9/1985 | Tsao | 427/253 |
| 4,584,207 | 4/1986 | Wilson | 427/253 |
| 4,595,608 | 6/1986 | King et al. | 427/253 |
| 4,741,928 | 5/1988 | Wilson et al. | 427/253 |

*Primary Examiner*—Sadie Childs
*Attorney, Agent, or Firm*—Antonelli, Terry & Wands

[57] ABSTRACT

A metal thin film is deposited on predetermined portions of an underlayer of a substrate by a chemical deposition method with good selectivity, good reproducibility and high deposition rate by preventing hydrogen atoms from the adhesion to portions of the substrate not to be deposited with a metal using a special means for heating only the substrate or a special gas flow controlling means.

10 Claims, 4 Drawing Sheets

METHOD FOR SELECTIVE DEPOSITION OF METAL THIN FILM

BACKGROUND OF THE INVENTION

This invention relates to a process and an apparatus for selective deposition of a metal thin film such as a tungsten thin film on a specified area of a substrate, particularly with high selectivity and high rate.

With higher integration of LSI, there have become finer individual elements and wiring, or diameters of contact-holes or through-holes formed on insulating films for contacting wiring with each other. On the other hand, since the thickness of insulating films cannot be reduced, a ratio of the depth to the diameters of these holes (aspect ratio) becomes larger, which results in making it remarkably difficult to fill up the holes with a conductive metal. For example, according to a sputtering method of aluminum which is the most general method for forming a metal film, the diameter of 2 μm and the aspect ratio of about 1 is the upper limit of filling up. In order to fill up holes having smaller diameter and larger aspect ratio, other methods should be applied. One of these methods is a selective chemical vapor deposition (CVD) method of a metal, typically tungsten (W), which method has been studied and many reports have been published.

According to a selective CVD method of W, tungsten hexafluoride ($WF_6$) and hydrogen ($H_2$) are used as starting material gases, which are introduced with a predetermined pressure and in a certain amount into a reactor wherein a heated substrate is installed. On the portions exposing silicon (Si) underlayer of the substrate, a W film is deposited by the following Si reduction reaction:

$$WF_6 + 3/2Si \rightarrow W + 3/2SiF_4 \uparrow \qquad (1).$$

By the Si reduction reaction, the W film can be grown up to several hundreds angstroms in thickness. Further, aluminum (Al) can also form a W film by directly reacting with $WF_6$ like Si. Since a catalytic action as to the adsorption and dissociation of $H_2$ takes place on the conductor film such as W film formed by the formula (1), the following reduction reactions proceed by H atom to continuously grow the film:

$$H_2 \rightarrow 2H \text{ (on catalyst surface)} \qquad (2)$$

$$WF_6 + 6H \rightarrow W + 6HF \qquad (3).$$

Further, since adsorption and dissociation of $H_2$ of the above formula (2) take place even on a conductor film of $MoSi_2$, $WSi_2$, $PtSi$, etc., a W film is deposited and grows. The above-mentioned reaction proceeds at a substrate temperature of about 200° C. or higher.

On the other hand, the Si reduction reaction of (1) does not take place on an insulating film of $SiO_2$, $Si_3N_4$, $Al_2O_3$ or the like. Further, since the catalytic action as to the adsorption and dissociation of $H_2$ at about 700° C. or less on such an insulating film does not take place, the dissociation of $H_2$ by the formula (2) does not take place to proceed the reduction reaction by the H atom, so that no metal thin film is formed. Therefore, according to the selective CVD method using a metal halide such as $WF_6$, or the like and $H_2$ as starting material gases, a metal thin film is selectively deposited on a underlayer of Si or a conductor metal, so that it is possible in principle to fill up holes however fine and deep these holes may be so long as the starting material gases are supplied into the holes.

But, according to a prior art selective CVD method for a metal thin layer, there takes place undesirably a phenomenon that a metal is deposited even on an insulating film of $SiO_2$, or the like.

As an apparatus for the selective CVD method for forming a metal thin film typified by a W thin film, there has been used a low pressure CVD apparatus excellent generally in a film thickness distribution and step coverage properties. In such a case, considering the selective formation of a metal thin film, it was necessary to make some device so as not to form a metal thin film on a reactor wall or the like other than the substrate. As the low pressure CVD apparatus, there are a hot-wall type and a cold-wall type.

The hot-wall type CVD apparatus is characterized by heating the whole reactor with a heater, and has an advantage in that infrared light from the heater transmits the reactor, the interior of which is heated uniformly. Further, in the case of forming a metal thin layer by using a metal halide gas such as $WF_6$, or the like and $H_2$, the selective film formation becomes possible by using quartz which suppress the formation of the metal thin layer as the reactor. But there is a problem in that when there are contaminations which become nuclei for film formation on the inner wall of the reactor even in trace amounts, the film formation area of metal thin film is enlarged around the nuclei as their centers and the metal thin film is finally formed on portions of the substrate not desired to be formed.

On the other hand, the cold-wall type CVD apparatus is characterized by cooling the whole reactor with water, while heating a substrate with an infrared lamp from a back side of the substrate, on the desired portion of front side of which is formed a metal thin film, together with substrate supporting units. According to a process for using such a cold-wall type CVD apparatus, there are advantages in that since heated portions other than the desired substrate surface on which a metal thin film is to be formed are not exposed to the starting material gases, the reaction between the reactor wall and the starting material gases does not take place and the film-forming rate is stable. Further, since the substrate is heated together with the substrate supporting units, there is an advantage in that the substrate surface temperature can be maintained uniformly. But there is a problem in that since the substrate supporting units are also heated, a metal thin film is also formed on the surface of substrate supporting units and a metal thin film formation area is enlarged therefrom so as to form a metal thin film on undesired portions of the substrate.

As mentioned above, according to the prior art processes, it was difficult to form thin films selectively on only the desired portions while maintaining good selectivity with good reproducibility without fail. In order to improve the selectivity in the prior art processes, it is possible to employ as general consideration a low temperature for the treatment (lower than 350° C.), a short deposition time, careful cleaning of a substrate surface, a small surface for deposition, etc. But there may bring about lowering in throughput and a limitation to the applications for processes. This is contrary to the desire to carry out selective film formation for obtaining any desired film thickness with a high film-forming rate while maintaining good selectivity. Selective CVD of W is disclosed, for example, in J. Electrochemical Society, vol. 131 (1984), pp. 1427-1433; Proc. 2nd. Int. IEEE VLSI Multilevel Interconnection Conf. vol. 25 (1985), pp. 343, etc. Further, apparatus for selective CVD of W is disclosed, for example, in U.S. Pat. No. 4,547,404, etc.

Further, the formation of a metal thin film on an insulating film of $SiO_2$ or the like using a metal halide gas and $H_2$ as the starting material gases is difficult as mentioned above in principle. But as disclosed in Extended Abstracts of the Meeting of 170th Electrochem. Soc. vol. 86-2, pp. 500 (1986, Oct.), when H atoms are produced in a gas phase by using $H_2$ plasma, etc., a metal thin film can easily be formed even on an insulating film of $SiO_2$, or the like. That is, since there is no catalytic action of adsorption and dissociation of $H_2$ on the insulating film of $SiO_2$ or the like, the dissociation reaction of the above-mentioned formula (2) does not take place. But by adhering H atoms produced in the gas phase to the insulating film of $SiO_2$ or the like, the reaction of formula (3) proceeds even on the surface of $SiO_2$ or the like to form a metal thin film of W. In other words, when H atoms are present in the gas phase from some causes and adhere to a surface of $SiO_2$ portions on which the formation of W or the like film is not desired, a metal is deposited thereon. But according to prior art selective CVD for forming metal thin films and apparatus used therefor, the prevention of the adhering of H atoms to surface portions on which the formation of the film is not desirable was not considered.

As mentioned above, according to the prior art technique, the prevention of degradation of selectivity, that is, the prevention of adhering of H atoms to an insulating film, this being a cause for depositing the metal on $SiO_2$ or the like insulating film on which the deposition of the metal is not desirable, was not considered and the metal thin film was not formed with good reproducibility, good selectivity and high rate.

SUMMARY OF THE INVENTION

It is an object of this invention to provide a process and an apparatus for forming a metal thin film rapidly with good reproducibility while maintaining good selectivity and overcoming the defects of prior art technique mentioned above.

This invention provides a process for selectively depositing a metal thin film on surfaces of predetermined portions of a substrate by a chemical vapor deposition method in a reactor, which comprises using as starting material gases a metal halide gas and a hydrogen gas, and heating at least the portions to be deposited with a metal thin layer to a temperature sufficient for reacting with the starting material gases, whereby the reaction with the starting material gases is not brought about on the portions of the substrate surface where the deposition of metal is not desired by preventing the adhesion (or adsorption) of hydrogen atoms thereto, and the reaction with the starting material gases is brought about for film formation on the portions of the substrate surface where the deposition of metal is desired.

This invention also provides an apparatus for selectively depositing a metal thin film on surfaces of predetermined portions of a substrate by a chemical vapor deposition method, characterized in that there is provided in a reactor a means for introducing starting material gases comprising a metal halide gas and a hydrogen gas, and a means for heating at least the portions to be deposited with a metal thin layer to a temperature sufficient for reacting with the starting material gases, whereby the reaction with the starting material gases is not brought about on the portions of the substrate surface where the deposition of metal is not desired by a means for preventing the adhesion of hydrogen atoms thereto, and the reaction with the starting material gases is brought about for film formation on the portions of the substrate surface where the deposition of metal is desired.

BRIEF DESCRIPTION OF THE DRAWINGS

FIG. 7 is a cross-sectional view of a surface portion of a substrate showing behaviors of H atoms at the time of selective filling up of a metal.

DESCRIPTION OF THE PREFERRED EMBODIMENTS

Figure 1:
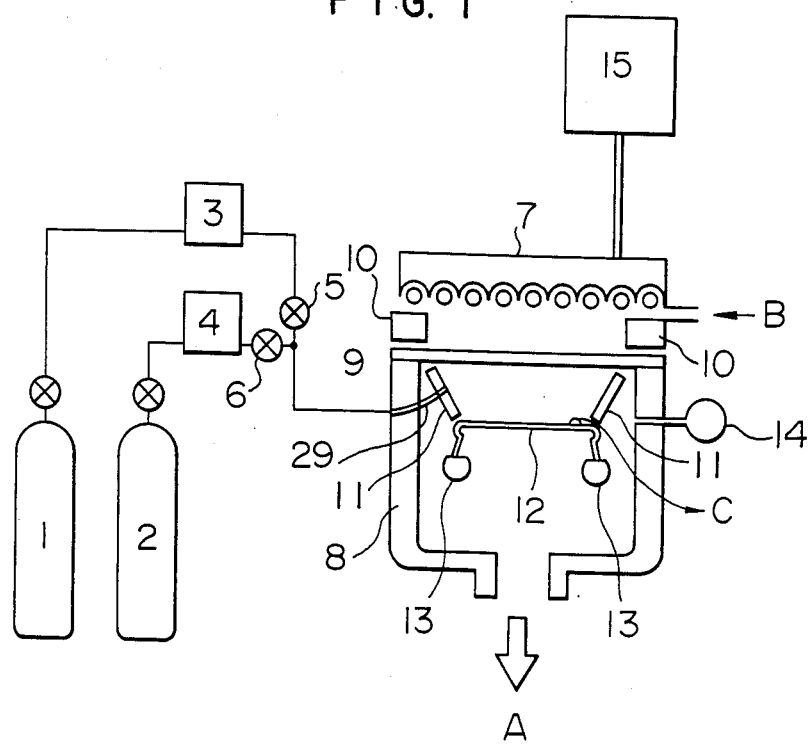
FIG. 1 is a schematic view of a whole apparatus for explaining one example of this invention.

According to this invention, hydrogen atoms are prevented from adhering to portions of a substrate surface where the formation of a metal thin film is not desired, that is, an insulating film of $SiO_2$ or the like, said adhesion of H atoms being a cause for degrading the selectivity. When the surface of insulating film such as $SiO_2$ or the like film has a temperature showing no catalytic action for adsorption and dissociation of $H_2$, no metal is deposited so long as H atoms are not adhered (or adsorbed) to the $SiO_2$ or the like insulating film.

Routes of H atoms for adhering to an insulating film in a prior art metal thin film selective CVD are shown in FIG. 7. A process for preventing H atoms from adhering to an insulating film is explained below referring to FIG. 7 in the most typical example of W selective CVD. FIG. 7 is a cross-sectional view of a substrate surface, wherein numeral 16 denotes $SiO_2$, numeral 17 denotes Si, numeral 18 denotes W, and numerals 101, 102 and 103 denote H atoms adhering to $SiO_2$ by various routes respectively. According to the first route (101), H atoms produced by adsorption and dissociation of $H_2$ at places other than the substrate, that is, mainly a heated reactor inner wall in the case of the hot-wall type CVD apparatus, and mainly heated substrate supporting units in the case of the cold-wall type CVD apparatus, are desorbed from the surface thereof, and diffuse and adhere to $SiO_2$ portions. According to the second route (102), H atoms produced by adsorption and dissociation at the surfaces of W which is formed in contact holes are desorbed from the surfaces thereof, and diffuse and adhere to $SiO_2$ portions. According to the third route (103), H atoms produced by adsorption and dissociation at the surfaces of W as mentioned above reach $SiO_2$ portions by surface diffusion (spillover H atoms). Among these routes, a phenomenon caused by the H atoms adhered to the $SiO_2$ portions by the third route reflects on the overflowing shape of W from contact holes which are filled up with W, but is quite different from insular W particles which are observed as a phenomenon of degradation in selectivity under ordinary film-forming conditions of W selective CVD. Such a phenomenon can be solved by regulating the pressure of starting material gases in the reactor and suppressing the surface diffusion of H atoms, so that there arises no problem. Therefore, in order to maintain good selectivity and to form W thin film rapidly with good reproducibility, it is necessary to suppress the first route H atoms completely by the methods mentioned below. Further, in order to suppress the second route H atoms, it is necessary to conduct the film formation at a temperature lower than the temperature at which the H atoms begin to desorb from the surfaces of W having filled the holes. The desorption of H atoms from the W surfaces of contact holes becomes more difficult, when the temperature becomes lower. But from the viewpoint of high deposition rate, to lower the temperature unnecessarily low is not preferable. Since the kinetic energy of H atoms present on the W surfaces takes the Boltzman distribution, the number of H atoms desorbed from the W surfaces does not change rapidly with a threshold value at a certain temperature and thus cannot be reduced to zero even if the temperature is lowered as low as possible.

The film formation with complete maintainance of selectivity means that even if W film is formed in contact holes as desired (usally 70 to 100% of the hole depth), W particles are not deposited on $SiO_2$ portions practically. Therefore, the upper limit of the heating temperature varies with changes of the opening area of contact hole portions and the opening rate of the hole portions against $SiO_2$ portions.

The number of H atoms subjecting to desorption and diffusion from the W surfaces at contact hole portions per unit time is compared at a temperature $T_1$ (K) and a temperature $T_2$ (K) as shown below. A ratio of the number of H atoms desorbed from a unit area per unit time at $T_1$ ($N_H(T_1)$) to the number of H atoms desorbed from a unit area per unit time at $T_2$ ($N_H(T_2)$) is represented by the following equation:

$$\frac{N_H(T_1)}{N_H(T_2)} = \frac{n_H(T_1) \times \exp\left(-\frac{\Delta E}{RT_1}\right)}{n_H(T_2) \times \exp\left(-\frac{\Delta E}{RT_2}\right)} \quad (4)$$

wherein $n_H(T_1)$ is the number of H atoms present on the surface generated by adsorption and dissociation per unit area at the temperature $T_1$, $n_H(T_2)$ is the number of H atoms present on the surface generated by adsorption and dissociation per unit area at the temperature $T_2$, $\Delta E$ is an activation energy for desorption (Kcal/mol), and R is a gas constant (Kcal/mol. K).

On the other hand, when the adsorption and dissociation of $H_2$ molecules on W are a rate controlling step of film formation reaction, a ratio of film formation rate at a temperature $T_1$ to that at a temperature $T_2$ (i.e. $R(T_1)/R(T_2)$) is represented by the following equation:

$$\frac{R(T_1)}{R(T_2)} = \frac{n_H(T_1)}{n_H(T_2)} \quad (5)$$

Since the time necessary for film formation to the predetermined thickness is inversely proportional to the film formation rate, a ratio of the number of H atoms desorbed from a unit area at the temperature $T_1$ until the end of film formation ($N'_H(T_1)$) to the number of H atoms desorbed from a unit area at the temperature $T_2$ until the end of film formation ($N'_H(T_2)$) is represented by the following equation taking the equations (4) and (5) into consideration:

$$\frac{N'_H(T_1)}{N'_H(T_2)} = \frac{\exp\left(-\frac{\Delta E}{RT_1}\right)}{\exp\left(-\frac{\Delta E}{RT_2}\right)} \quad (6)$$

Here, the activation energy for desorption ($\Delta E$) is equal to the bond energy Do (W-H) of the adsorbed H atom and W (W-H) on the W metal surface. It is known from literature that $\Delta E = 78$ (Kcal/mol). When $T_1 = 550°$ C. ($=823$ K), $T_2 = 600°$ C. ($=873$ K), the ratio of H atom numbers desorbed from the W surface until the end of film formation becomes 1:17. This value changes depending on the difference in the bond energy Do (Me-H) (Me: a metal atom). For example, when surfaces of bottoms (that is, an underlayer) of contact holes is made of Pt, $\Delta E = 66$ (Kcal/mol) which value is smaller than W, so that the ratio of H atom numbers desorbed from the Pt surface becomes 1:10. This means that the desorption reducing effect by temperature lowering is small compared with the case of W.

In an example mentioned below, mention is only made on a limited reaction system under limited reaction conditions. But the prevention of adhering of H atoms to the $SiO_2$ portions by the second route can only be attained fundamentally by lowering the substrate temperature. In an example of selective W film formation mentioned below, the adhesion of H atoms to the $SiO_2$ portions by the second route is prevented completely by making the substrate temperature 590° C. or lower, preferably, 580° C. or lower, more preferably 550° C. to 250° C.

According to this invention, so long as the adhesion of H atoms by the second route is prevented, that is, film formation is carried out at a temperature lower than the temperature at which H atoms begin to desorb from the surface of W formed in the holes, there can be attained the object of forming a metal thin film rapidly with good reproducibility while maintaining the good selectivity mentioned above, provided that the adhesion of H atoms by the first route is completely prevented. Therefore, the prevention of adhesion of H atoms by the first route becomes an important problem. This is explained below in detail.

There are two methods for preventing the adhesion of H atoms by the first route, wherein H atoms, which are produced by adsorption and dissociation of hydrogen molecules at the inner wall of the reactor, the substrate supporting units, and the like other than the substrate, desorb from these surfaces, and diffuse and adhere to the $SiO_2$ portions as shown in FIG. 7.

A first method of the two is to heat only the substrate and to remove a cause for generating H atoms by suppressing the temperatures of surfaces, which contact with the starting material gases, such as the inner wall of the reactor, the substrate supporting units, and the like other than the substrate as low as possible, that is, the temperature lower than the desorption temperature of H atoms, for example 200° C. or lower, more preferably 100° C. to 0° C. A second method of the two is to prevent H atoms, which are desorbed and diffused from the surfaces other than the substrate, from reaching portions of the substrate on which the deposition of a metal is not desired by controlling the gas flows.

According to the first method, it is preferable to use a light source emitting light which can be absorbed by the substrate material and the metal formed as a means for heating the substrate. Portions other than the substrate is prevented from irradiation of light from the light source, and even if irradiated, the temperature rise is prevented by a cooling means such as water cooling. Thus, the generation of H atoms at portions other than the substrate is prevented.

According to the second method, the heating means is not a problem. It is important to form a cooled gas flow controlling means for separating a space which contacts with the surface of heated substrate on which a metal thin film is to be formed selectively, from a space which contacts with the surfaces of inner wall of the reactor, the substrate suporting units, and the like, from which H atoms can be generated, by retaining a fine gap along the periphery of the substrate. Into an inner space surrounded by the substrate and the gas flow controlling plate, the starting material gases including no H atoms dissociated are introduced. These gases are evacuated by passing through the fine gap along the periphery of the substrate to give a high flow rate, which prevents the H atoms generated in spaces other than the above-mentioned space from reaching the surface portions of the substrate on which the deposition of metal is not desired. Since the reaction pressure in a selective CVD for metal thin film by using an ordinary low-pressure CVD apparatus is 0.1 Torr or more, the gas flow is a viscous flow. Therefore, the flow rate of the starting material gases passing through the fine gap mentioned above after the reaction is at least 3 times, usually several times as much as the diffusion rate of H atoms, the reaching of H atoms by diffusion to the insulating film such as SiO$_2$, etc. on the substrate on which the formation of a metal thin film is not desired is prevented. The flow rate v (cm/sec) passing through the fine gap can be represented by the following equation:

$$v = \frac{1}{60} \times \frac{760}{P} \times \frac{V}{\pi \times r \times d} \quad (7)$$

wherein V (sccm) is the flow amount of starting material gases; P (Torr) is the pressure; r (cm) is the diameter of the substrate; and d (cm) is the distance of the gap. Provided that V=500 (sccm), P=10 (Torr), r=5.0 (cm), and d=0.1 (cm), the flow rate v=1006 (cm/sec) is obtained.

On the other hand, when the diffusion coefficient of H atoms is $D_p$ (cm$^2$/sec) at a pressure P, and the time is t (sec), the diffusion distance L (cm) is represented by the equation:

$$L = \sqrt{D_p \times t} \quad (8)$$

As is clear from the equation (8), since the diffusion distance is not proportional to the time in the first degree, it is impossible to define the diffusion rate per unit time. Provided that t=1 (sec), L≈2 to 7 (cm) is obtained, and thus the diffusion rate of 2 to 7 (cm/sec) is obtained from the distance of 2 to 7 cm per unit time of 1 sec. Under the above-mentioned conditions, since the flow rate passing through the fine gap mentioned above after the reaction of the starting material gases is several hundreds times as fast as the diffusion rate of H atoms, the adhesion of H atoms to the SiO$_2$ portions can sufficiently be prevented.

This invention is further illustrated referring to the attached drawings. A W thin film is selectively formed on only a lot of contact holes (0.6 to 2.0 μm□, depth 1.1 μm, opening rate 1/16 to ¼) formed in a silicon (Si) substrate covered with a thermal oxide film (SiO$_2$) using tungsten hexafluoride (WF$_6$) and hydrogen (H$_2$) as the starting material gases. An example is carried out by using an apparatus shown in FIG. 1, wherein the substrate is only heated and the desorption and adhesion of hydrogen atoms is prevented by cooling portions of inner wall of the reactor, substrate supporting units, gas inlet pipes and other inner surfaces in the reactor exposed to the starting material gases other than the substrate. On the other hand, another example is carried out by using an apparatus shown in FIG. 3, wherein the adhesion of H atoms is prevented by controlling gas flows so as to prevent hydrogen atoms generated by adsorption and dissociation of hydrogen molecules at portions in the reactor other than the substrate from reaching the portions of the substrate not to be deposited with a metal.

In FIG. 1, numeral 1 denotes a WF$_6$ bomb, numeral 2 denotes a H$_2$ bomb, numerals 3 and 4 denote mass flow controllers, respectively, numerals 5 and 6 denote stop valves for the gases, respectively, numeral 7 is a halogen lamp attaching a reflective mirror cooled with water, and a wafer (substrate) 12 is heated by the light irradiated from the lamp and passed through an irradiation window 9 made of quartz. Numeral 8 denotes a reactor cooled with water so as to suppress the temperature rise of the inner wall by irradiation of light. Further, the reactor is connected to a vacuum evacuation system (not shown in the drawing) in the direction A. In order to suppress the temperature rise of the irradiation window 9 and inner wall of the reactor 8 when the halogen lamp 7 is lighted, water-cooled shading plates 10 and 11 are provided outside and inside of the reactor 8, respectively, and the irradiation window 9 is cooled by air blown from the direction B. Further, the wafer 12 is supported by water-cooled substrate supporting means 13 so as to make almost point contact at 3 points so as not to lower the substrate temperature.

The shading plate 11 and the substrate supporting means 13 are water-cooled to a temperature of 200° C. or lower, preferably 100° C. to 0° C. In addition, the shading plate 11 provided in the reactor 8 is made so as to diffuse the starting material gases effectively on the wafer by connecting to the inlet 29 of the starting material gases. In FIG. 1, numeral 14 is a manometer and numeral 15 is a power controller.

Figure 2:
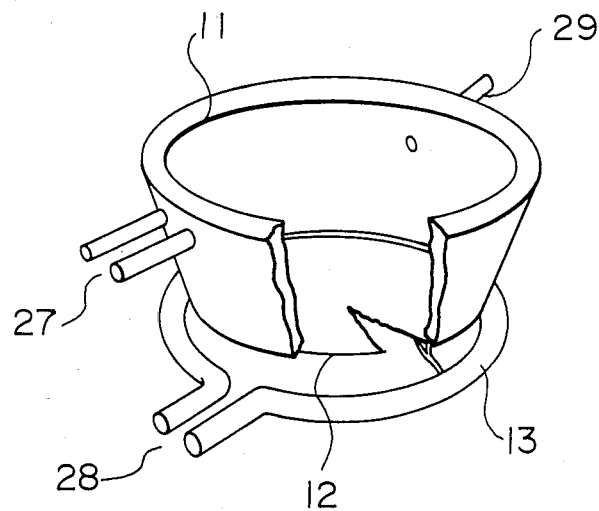
FIG. 2 is an enlarged and partly broken perspective view of surrounding portions of a substrate (wafer) of FIG. 1.

FIG. 2 is an enlarged perspective view showing the periphery portions of the wafer 12 of FIG. 1 in detail. In FIG. 2, the shading plate 11 and the wafer 12 are partly broken so as to make the understanding easy. In FIG. 2, numeral 27 denotes a pipe for water cooling the shading plate, numeral 28 denotes a pipe for water cooling the substrate supporting means.

In this Example, since the vapor-phase growth (or deposition) is carried out by using an experimental apparatus, the temperature of wafer 12 is measured by a thermocouple directly attaching a 0.25 φ thermocouple to the wafer 12 using a ceramic adhesive. Further, the temperature of wafer 12 is controlled by monitoring the voltage output C from the thermocouple and changing the output of the halogen lamp 7 by the power controller 15. The pressure in the reactor 8 is controlled by monitoring it by a capacitance manometer 14 and changing the conductance of the evacuation system (not shown in FIG. 1) in the direction A.

Next, the formation of W for filling up only contact holes formed in a silicon wafer is explained in accordance with the procedures.

The reactor 8 is evacuated so as to make a vacuum of $10^{-3}$ Torr or less. After the evacuation, $H_2$ gas is introduced into the reactor 8 and a halogen lamp is lighted simultaneously to begin the heating of the substrate (silicon wafer). The flow amount of $H_2$ is controlled by the mass flow controller 4 to 500 sccm. The pressure in the reactor 8 is maintained at 10 Torr by the conductance controller of the evacuation system (not shown in FIG. 1) and the temperature of the substrate 12 is set at 550° C. by the power controller 15 of the halogen lamp 7. When both the pressure and temperature are stabilized, $WF_6$ is introduced into the reactor. The flow amount of $WF_6$ is maintained at 3 sccm by the mass flow controller 3. By the introduction of $WF_6$, slight changes in the pressure and the temperature are observed, but the predetermined values are recovered again after several seconds by the controllers, respectively. After 2.5 minutes from the introduction of $WF_6$, the supply of each gas is stopped by the stop valves 5 and 6. At the same time, the halogen lamp is put out to stop the heating of the substrate 12 and the residual gases in the reactor are evacuated. After cooling the substrate to 100° C. or lower, the reactor is leaked to an atmospheric pressure and the substrate 12 is taken out of the reactor 8. By the above procedure, the contact holes with 1 μm deep are filled up with W with about 0.9 μm in film thickness. The selectivity is evaluated by cutting the wafer 12 and observing the peripheries of contact holes with a scanning electron microscope (SEM). According to the above-mentioned Example, the contact hole portions were filled up with W almost completely, while $SiO_2$ portions 16 around the holes were not changed at all. This means that the selectivity is very good.

The pressure and the temperature mentioned in the above Example are only one example, respectively. There can be used a pressure of 0.2 to 10 Torr and a temperature of 590° C. or lower, more preferably 250° to 550° C. The flow rate of $H_2$ may be changed from 100 to 500 sccm and that of $WF_6$ from 3 to 50 sccm, while maintaining the ratio of the flow rates ($H_2/WF_6$) from 20/1 to 200/1. By employing the above-mentioned conditions, the metal (W) thin film can be deposited with good selectivity. There is a tendency to lower the film formation rate when the temperature and the pressure are lowered as in a prior art process, but according to this invention, the upper limits of the temperature and the pressure can be raised remarkably as mentioned above.

In the next place, the selectivity is evaluated by repeating the above-mentioned Example except for changing the substrate temperature to 600° C. and film formation time to 2 minutes. The observation by SEM revealed that on $SiO_2$ 16 portions around contact holes, insular tungsten particles were formed to degrade the selectivity.

This degradation in the selectivity seems to be caused by H atoms which are generated by adsorption and dissociation on the surface of the tungsten 18 in the contact hole portions of the substrate surface, adhered to the $SiO_2$ portions 16 by desorption and diffusion. The number of H atoms desorbed from the hole portion W surface 18 which degrade the selectivity by adhering to the $SiO_2$ portions and are counted from the initial time of film formation till the completion of film formation is about 17 times at 600° C. statistically as large as those at 550° C. from the equation (6). Since the degradation in selectivity does not change rapidly around a threshold value, it is difficult to determine a temperature at which the selectivity is clearly degraded. But, from the above-mentioned Examples, it is most preferable to conduct the film formation at about 550° C. or lower in order to maintain the practically usable selectivity. Even if conducted at 550° C., the film-forming rate is 360 nm/min from the above-mentioned Examples, said value being improved by several times to several tens times compared with prior art processes and practically usable.

Figure 3:
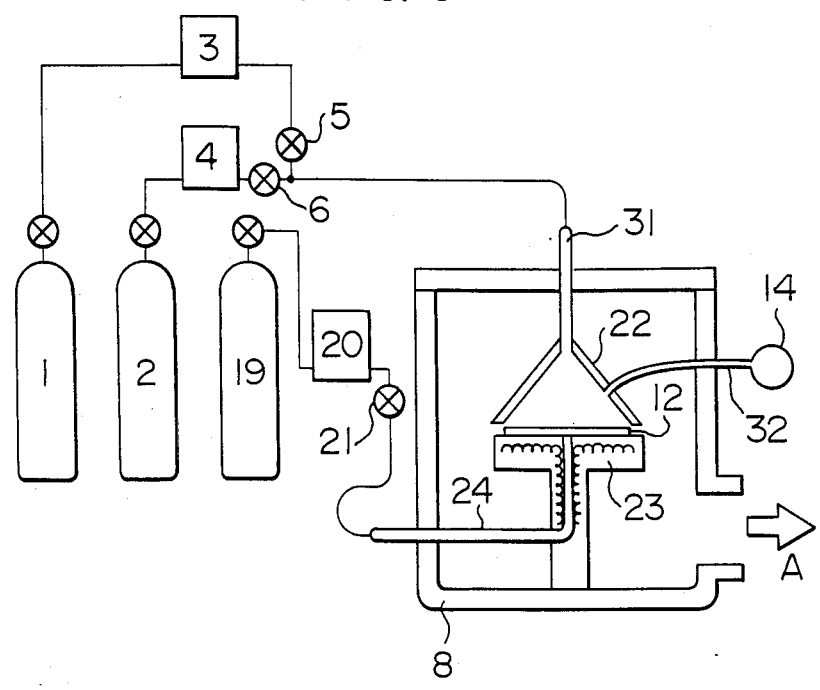
FIG. 3 is a schematic view of a whole apparatus for explaining another example of this invention.

Another Example is explained referring to FIG. 3 wherein even if H atoms are generated at portions other than the substrate when heated, the adhesion of H atoms to the substrate is prevented by controlling the gas flows.

Figure 4:
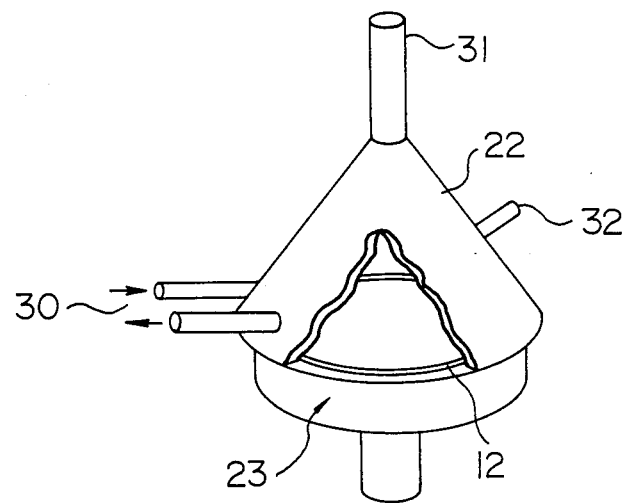
FIG. 4 is an enlarged and partly broken perspective view of surrounding portions of a substrate (wafer) of FIG. 3.

In FIG. 3, explanation for the same numerals as used in FIG. 1 is omitted for simplicity. Numeral 19 denotes a bomb of inert gas such as Ar, He, $N_2$, or the like which does not pertain to the reaction, numeral 20 denotes a flow regulator, numeral 21 denotes a stop value, numeral 22 denotes a water-cooled gas flow controlling means such as a plate and numeral 23 denotes a substrate stage including a heater for heating the substrate. $WF_6$ and $H_2$ introduced from the bombs 1 and 2, respectively, are flowed out of only a small gap (usually 0.1 to 10 mm, preferably 1 to 8 mm, in this Example about 1 mm) between the gas flow controlling plate 22 and the substrate stage 23 and evacuated by the evacuation system (not shown in FIG. 3) in the direction of A. Therefore, H atoms generated at the surface of the substrate stage 23 outside of the substrate do not diffuse and adhere to the surface of substrate 12 via the gap between the gas flow controlling plate 22 and the substrate stage 23. FIG. 4 is an enlarged perspective view showing the periphery portions of the wafer 12 of FIG. 3. In FIG. 4, the gas flow controlling plate 22 is partly broken so as to make the understanding easy. In FIG. 4, numeral 30 is a pipe for water-cooling the gas flow controlling plate, numeral 31 denotes a gas introducing pipe, and numeral 32 denotes a pipe for a manometer. The temperature of the substrate 12 is controlled by uniformly heating the whole substrate by the thermal conductivity obtained from the heat of the heated substrate stage 23 carried by the inert gas introduced from the bomb 19 and passed to the gap between the substrate stage 23 surface and the rear side of substrate through the gas inlet 24 for thermal conductivity. Since the gas flow controlling plate 22 is water cooled at a temperature of 200° C. or lower, preferably 100° C. to 0° C., and its temperature rise due to radiation heat from the substrate stage 23 is suppressed, no H atoms are generated.

The substrate temperature is measured by directly contacting the thermocouple with the substrate 12 in the same manner as mentioned above and the temperature control is conducted by changing a heater output of the heater included in the substrate stage 23. The pressure of the inside surrounded by the gas flow controlling plate 22, the substrate and the substrate stage 23 is controlled by monitoring with the capacitance manometer 14 and changing the gap between the gas flow controlling plate 22 and the substrate stage 23 so as to change the conductance.

The formation of W for filling up only contact holes formed in a silicon wafer is explained in accordance with the procedures.

The reactor 8 is evacuated so as to make a vacuum of $10^{-3}$ Torr or less. At the same time, an electric current is passed through the heater included in the substrate stage 23 to heat the substrate stage 23. After the evacuation, 500 sccm of $H_2$ gas is introduced into the reactor 8 and 200 sccm of Ar was flowed to the reactor 8 from the bomb 19 as a gas for thermal conductivity. the gap between the gas flow controlling plate 22 and the substrate stage 23 is regulated so as to make the capacitance manometer 14 show 10 Torr when 3 sccm of $WF_6$ and 500 sccm of $H_2$ are introduced while maintaining the substrate stage 23 temperature at room temperature, so that the pressure sensor 14 shows about 9.5 Torr before the introduction of $WF_6$. When the temperature of the substrate 12 is raised to 550° C. and stabilized, $WF_6$ is introduced into the reactor 8. After the introduction of $WF_6$, the reading of the manometer 14 increases gradually but is stabilized at about 10 Torr. After 3 minutes from the introduction of $WF_6$, the supply of each gas is stopped by individual stop values 5, 6, and 21. At the same time, the heater of the substrate stage is turned off to stop the heating of substrate and the residual gases in the reactor are evacuated. After the substrate 12 is cooled to 100° C. or lower, the reactor 8 is leaked and the substrate 12 is taken out. The selectivity is evaluated in the same manner as mentioned above by the SEM observation to admit that the selectivity is very good. In this Example, the same conditions as mentioned in the Example using the apparatus of FIG. 1 can also be employed.

The lower the pressure becomes, the larger the ratio of the starting material gases passing through the fine gap along the periphery portion of the substrate after the reaction to the diffusion rate of H atoms becomes, so that the employment of a lower pressure is advantageous for maintaining good selectivity.

The shape of the gas flow controlling means is not limited to that shown in FIGS. 3 and 4. Any shapes which exhibit the above-mentioned effects such as a cylinder, a semi-sphere, and the like, can be employed.

Figure 5:
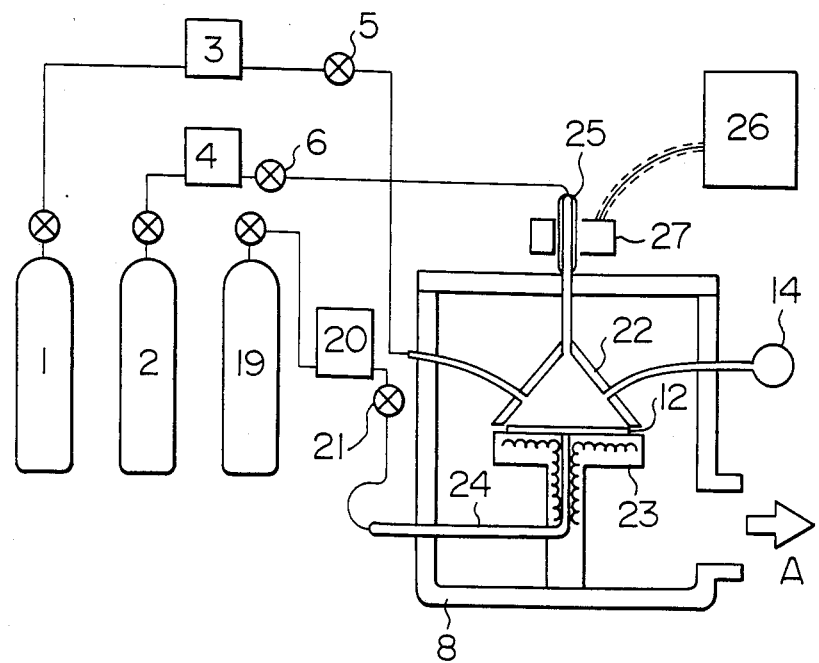
FIGS. 5 and 6 are schematic views of whole apparatus used for conducting experiments comparing with the Examples of this invention.

The next Example is carried out in order to ascertain whether the selectivity is degraded by the H atoms or not by using an apparatus shown in FIG. 5.

The apparatus of FIG. 5 is almost the same as that of FIG. 3 except that the starting material gases $WF_6$ and $H_2$ are introduced into the reactor 8 separately and a $H_2$ introducing pipe is surrounded by a quartz tube 25 so as to produce $H_2$ plasma by microwaves from the outside. Numeral 26 denotes a microwave oscillator and numeral 27 denotes a microwave resonator. When the film formation is carried out in the same manner as mentioned above using the apparatus of FIG. 3 while the power source for the microwave oscillator is turned off, the same results are admitted, that is, the selectivity is very good.

In the next place, the power source of the microwave oscillator 26 is turned on and $H_2$ plasma produced is also introduced into the reactor 8 as H atoms together with $H_2$ used in the Example using the apparatus of FIG. 3. Since the plasma disappears above 3 Torr, the pressure of plasmas is made 3 Torr. Further, since the plasma disappears below the output of lower than 20 W of the microwave oscillator, the plasma is produced at the output of 20 to 80 W. In individual cases, W is formed on the $SiO_2$ portions 16 around the contact holes, so that the selectivity is degraded remarkably to be lost. With an increase of the output of the microwave oscillator 26, the surface of W film on the $SiO_2$ 16 portions becomes smooth from the rough state. This means that W is formed more uuniformly. Further, this phenomenon takes place on the whole surface of the substrate.

The above-mentioned results show that when H atoms are formed in the gas phase, W is formed irrespective of the material of the surface of substrate 12, and the more the H atoms present in the gas phase become, a uniform film of W can be formed even on the $SiO_2$ 16 surface, on which the formation of W is inherently difficult. This means that in order to form the W film selectively, it is necessary to remove the H atoms present in the gas phase as completely as possible. On the other hand, since the lower end of the plasma discharge region is apart from the substrate 12 by 10 cm or more, it is not necessary to consider the influence of charged particles present in the plasma. Further, since the gas introduced is only $H_2$, neutral particles present other than $H_2$ are only H atoms.

The next Example is carried out for studying why the selectivity is degraded in the prior art W selective CVD method.

Figure 6:
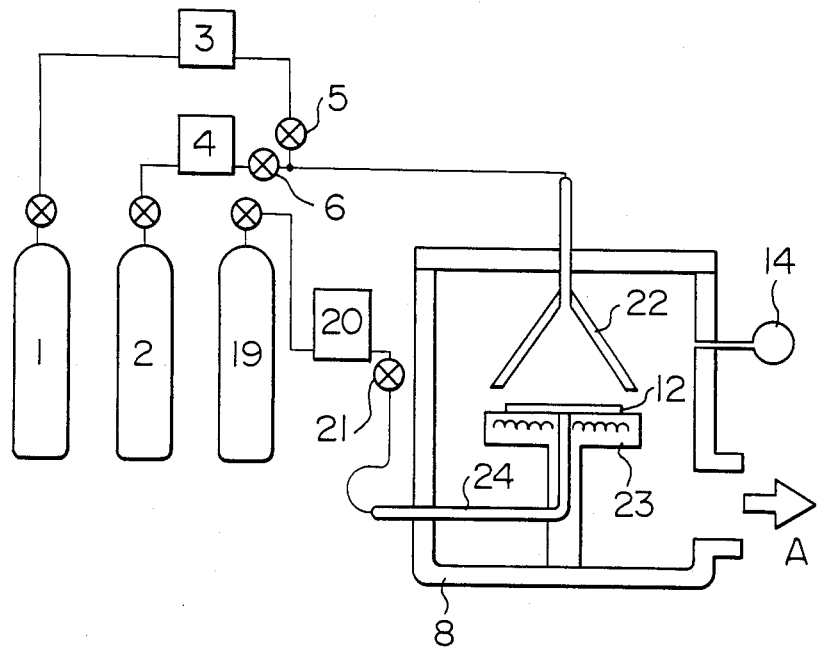

In this Example, the apparatus shown in FIG. 6 is used. The apparatus of FIG. 6 is almost the same as that of FIG. 3 except that the gas flow controlling plate 22 is apart from the substrate 12 by 3 cm or more so as to make the presence of it negligible and the pressure in the reactor 8 is controlled by changing the conductance of the evacuation system (not shown in FIG. 6) in the direction A. The procedures for the film formation are carried out in the same manner as described in those using the apparatus of FIG. 3 except that the position for changing the conductance controlling the pressure in the reactor 8 is different and the pressure at the film formation is 12.3 Torr due to the influence of the inert gas used for heating the substrate on the reading of the capacitance manometer 14. This is because when the substrate stage 23 is at room temperature, and 3 sccm of $WF_6$ and 500 sccm of $H_2$ are introduced into the reactor 8 and the conductance of the evacuation system is regulated so as to make the pressure 10 Torr, followed by the introduction of 200 sccm of Ar, the reading of the capacitance manometer 14 shows 12.3 Torr. Therefore, when the film formation is carried out under a total pressure of 12.3 Torr, it may be considered that the film formation is carried out under a pressure of about 10 Torr which is a total of partial pressures of $WF_6$ and $H_2$, although the value may be changed depending on the difference in viscosities of the gases. When the film formation is carried out by using the apparatus shown in FIG. 6 in the same manner as the process using the apparatus of FIG. 3, the selectivity is poor. Further, a lot of insular formation of W is observed particularly on the $SiO_2$ portions 16 at the periphery portion of the substrate 12 and the number of insular W particles is reduced accordingly near the central portion of the substrate. In the Example using the apparatus of FIG. 5, the selectivity is degraded on the whole surface of the substrate 12, while in the Example using the apparatus of FIG. 6, the selectivity is degraded from the periphery portion of the substrate 12. This can be explained as follows. In FIG. 5, H atoms are generated in the gas phase considerably apart from the substrate 12 by about 10 cm or more, and diffused and adsorbed on the whole surface of the substrate to degrade the selectivity. In contrast, in FIG. 6, H atoms are generated and desorbed on the surface of the substrate stage 23 having a metal surface with high temperatures, and diffused from the periphery portion of the substrate 12 and adsorbed to degrade the selectivity.

From the results obtained by using the apparatus shown in FIGS. 3 to 6, it is revealed that the degradation in selectivity in the prior art processes is caused by the adsorption of H atoms on the $SiO_2$ portions 16. By suppressing the generation of H atoms by using the apparatus shown in FIGS. 1 to 4, a metal thin film can be formed on a special underlayer of a substrate with a high rate of film formation (upto 360 nm/min) while maintaining high selectivity.

This invention can be applied to any reaction systems for forming metal thin films by hydrogen reduction. As the metal halide gases, there can be used $WF_6$, $WCl_6$, $WCl_5$, $MoF_6$, $MoCl_5$, $TiCl_4$, $TaCl_5$, $NbCl_5$, $PtF_6$, $IrF_6$, $ReF_6$, etc.

As the materials for surfaces of predetermined portions of the substrate (the underlayer), there can be used a metal such as Al, Cu, Ni, Cr, Mo, Pt, Ti, Si, or the like, a metal silicide such as $WSi_x$, $MoSi_x$, $TiSi_x$, $PtSi_x$, or the like, a metal nitride such as $TiN_y$, $WN_y$, or the like (in which x and y are production ratio of the compounds), etc.

As the material for the portions other than the substrate, there can be used silicon oxide, silicon nitride, alumina, diamond or an organic insulating film such as polyimide films (e.g. PIQ), etc.

By using these materials, corresponding metal thin films can be produced with high selectivity.

As mentioned above, since metal thin films can be formed on special surface portions of substrates with good selectivity according to this invention, highly integrated LSI using W, Mo, or the like for filling up contact holes and through-holes can be produced with improved yields and improved reliability.

What is claimed is:

1. A process for selectively depositing a metal thin film on surfaces of predetermined portions of a substrate by a chemical vapor deposition method in a reactor, which comprises using as starting material gases a metal halide gas and a hydrogen gas, and heating at least the portions to be deposited with a metal thin layer to a temperature sufficient for reacting with the starting material gases, whereby the reaction with the starting material gases, is not brought about on the portions of the substrate surface where the deposition of metal is not desired by preventing the adhesion of hydrogen atoms thereto, the prevention of adhesion of hydrogen atoms being accomplished by cooling portions other than the substrate of an apparatus in which the chemical vapor deposition takes place, and which are exposed to the starting material gases, and the reaction with the starting material gases is brought about for film formation on the portions of the substrate surface where the deposition of metal is desired.

2. A process according to claim 1, wherein the heating to a temperature sufficient for reacting with the starting material gases is carried out by using a light source emitting light which can be absorbed by the substrate material and the metal formed.

3. A process according to claim 1, wherein the metal halide is at least one member selected from the group consisting of $WF_6$, $WCl_5$, $WCl_6$, $MoF_6$, $MoCl_5$, $TiCl_4$, $TaCl_5$, $NbCl_5$, $PtF_6$, $IrF_6$, and $ReF_6$.

4. A process according to claim 1, wherein the surfaces of predetermined portions of a substrate is made of a material which reacts with the metal halide gas at a predetermined temperature to form a metal, or has a catalytic action for adsorption and dissociation of hydrogen gas, and portions other than the substrate in the reactor are made of a material having no catalytic action and not reacting with the metal halide gas at the above-mentioned predetermined temperature.

5. A process according to claim 4, wherein the material for the surface of predetermined portions of the substrate is silicon, a metal, a metal silicide or a metal nitride, and the material for the portions other than the substrate is silicon oxide, silicon nitride, alumina, diamond or an organic insulating film.

6. A process for selectively depositing a metal thin film on surfaces of predetermined portions of a substrate by a chemical vapor deposition method in a reactor, which comprises using as starting material gases a metal halide gas and a hydrogen gas, and heating at least the portions to be deposited with a metal thin layer to a temperature sufficient for reacting with the starting material gases, whereby the reaction with the starting material gases is not brought about on the portions of the substrate surface where the deposition of metal is not desired by preventing the adhesion of hydrogen atoms thereto, and the reaction with the starting material gases is brought about for film formation on the portions of the substrate surface where the deposition of metal is desired wherein the prevention of adhesion of hydrogen atoms is accomplished by controlling gas flows so as to prevent hydrogen atoms generated by adsorption and dissociation of hydrogen molecules at portions in the reactor other than the substrate from reaching the portions of the substrate not to be deposited with a metal.

7. A process according to claim 6, wherein the prevention of hydrogen atoms from reaching the portions of the substrate not to be deposited with a metal is attained by (1) providing a cooled gas flow controlling means which separates a space contacting with surfaces of inner wall of a reactor and substrate supporting units capable of generating hydrogen atoms, from a space contacting with the surface of substrate to be deposited with a metal thin film with a fine gap along the periphery portion of the substrate, (2) introducing the starting material gases containing no dissociated hydrogen atoms into an inner space surrounded by the substrate and the gas flow controlling means, and (3) making the flow rate of the starting material gases passing through the fine gap along the periphery portion of the substrate after the reaction with the substrate surface at least 3 times as fast as a diffusion rate of hydrogen atoms generated in portions other than the substrate so as to prevent the hydrogen atoms from reaching the portions of the substrate not to be deposited with a metal.

8. A process according to claim 6, wherein the metal halide is at least one member selected from the group consisting of $WF_6$, $WCl_5$, $WCl_6$, $MoF_6$, $MoCl_5$, $TiCl_4$, $TaCl_5$, $NbCl_5$, $PtF_6$, $IrF_6$, and $ReF_6$.

9. A process according to claim 6, wherein the surfaces of predetermined portions of a substrate is made of a material which reacts with the metal halide gas at a predetermined temperature to form a metal, or has a catalytic action for adsorption and dissociation of hydrogen gas, and portions other than the substrate in the reactor are made of a material having no catalytic action and not reacting with the metal halide gas at the above-mentioned predetermined temperature.

10. A process according to claim 9, wherein the material for the surfaces of predetermined portions of the substrate is silicon, a metal, a metal silicide or a metal nitride, and the material for the portions other than the substrate is silicon oxide, silicon nitride, alumina, diamond or an organic insulating film.

* * * * *